United States Patent
Ku (10) Patent No.: US 9,159,944 B2
(45) Date of Patent: Oct. 13, 2015

(54) WHITE ORGANIC LIGHT-EMITTING DIODES

(71) Applicant: INDUSTRIAL TECHNOLOGY RESEARCH INSTITUTE, Chutung, Hsinchu (TW)

(72) Inventor: Chun-Neng Ku, Tainan (TW)

(73) Assignee: INDUSTRIAL TECHNOLOGY RESEARCH INSTITUTE, Chutung, Hsinchu (TW)

( * ) Notice: Subject to any disclaimer, the term of this patent is extended or adjusted under 35 U.S.C. 154(b) by 0 days.

(21) Appl. No.: 13/933,591

(22) Filed: Jul. 2, 2013

(65) Prior Publication Data

US 2014/0175392 A1 Jun. 26, 2014

(30) Foreign Application Priority Data

Dec. 20, 2012 (TW) .............................. 101148604 A (51) Int. Cl.
*H01L 29/08* (2006.01)
*H01L 51/50* (2006.01)

(52) U.S. Cl.
CPC ....... *H01L 51/504* (2013.01); *H01L 2251/5384* (2013.01)

(58) Field of Classification Search
CPC ............ H01L 51/5036; H01L 51/5016; H01L 51/5012
USPC ............................................ 257/40, 79–103
See application file for complete search history.

(56) References Cited

U.S. PATENT DOCUMENTS

| 6,806,491 | B2 | 10/2004 | Qiu et al. | |
|---|---|---|---|---|
| 7,507,485 | B2 | 3/2009 | Oh et al. | |
| 7,776,456 | B2 * | 8/2010 | D'Andrade et al. | 428/690 |
| 7,928,652 | B2 | 4/2011 | Kitamura et al. | |
| 8,242,489 | B2 | 8/2012 | Kondakova et al. | |
| 2004/0124766 | A1 * | 7/2004 | Nakagawa et al. | 313/504 |
| 2009/0146552 | A1 * | 6/2009 | Spindler et al. | 313/504 |
| 2011/0062427 | A1 * | 3/2011 | Jeong et al. | 257/40 |

FOREIGN PATENT DOCUMENTS

| TW | I333392 | 11/2010 |
|---|---|---|
| TW | 201044662 | 12/2010 |
| TW | 201115805 | 5/2011 |

OTHER PUBLICATIONS

Yu et al., "Film thickness influence of dual iridium complex ultrathin layers on the performance of nondoped white organic light-emitting diodes", Elsevier, Displays, 2011, pp. 87-91, vol. 32.

(Continued)

*Primary Examiner* — Cuong Q Nguyen
*Assistant Examiner* — Nishath Yasmeen
(74) *Attorney, Agent, or Firm* — Muncy, Geissler, Olds & Lowe, P.C.

(57) ABSTRACT

In an embodiment of the present disclosure, a white organic light-emitting diode is provided. The white organic light-emitting diode includes an anode, a cathode, and a composite light-emitting layer formed between the anode and the cathode, the composite light-emitting layer including a first host layer, a second host layer, and a dye layer formed between the first host layer and the second host layer, and the dye layer including at least two dyes.

9 Claims, 8 Drawing Sheets

(56) References Cited

OTHER PUBLICATIONS

Liu et al., "Enhanced efficiency and reduced roll-off in nondoped phosphorescent organic light-emitting devices with triplet multiple quantum well structures", 2010 American Institute of Physics, Applied Physics Letters, 2010, pp. 083304-1-083304-3, vol. 97.

Koo et al., "Enhanced life time and suppressed efficiency roll-off in phosphorescent organic light-emitting diodes with multiple quantum well structures", AIP Advances 2, 2012, pp. 012117-1-012117-6.

Zhao et al., "Non-doped phosphorescent white organic light-emitting devices with a quadruple-quantum-well structure", Elsevier, Physica B, 2012, pp. 2753-2757, vol. 407.

Yingkui et al., "Nondoped phosphorescent organic quantum well light-emitting device based on iridium complex: Synthesis, characterization, photophysical property, and electroluminescence performance", Elsevier, Journal of Luminescence, 2011, pp. 1821-1826, vol. 131.

* cited by examiner

WHITE ORGANIC LIGHT-EMITTING DIODES

CROSS REFERENCE TO RELATED APPLICATIONS

This application claims priority of Taiwan Patent Application No. 101148604, filed on Dec. 20, 2012, the entirety of which is incorporated by reference herein.

TECHNICAL FIELD

The technical field relates to a white organic light-emitting diode with low operating voltage and high efficiency.

BACKGROUND

Currently, in widely-adopted OLED devices, the light-emitting layer thereof is formed by mixing host and dopant. Each dopant needs to go with its appropriate host material and the ratio therebetween tremendously influences the efficiency of OLED devices. However, it is extremely difficult to control the concentration and uniformity of the dopant. In order to resolve this problem, sophisticated and complicated equipment is required which correspondingly increases the cost of production. Therefore, development of an OLED device with a simple manufacturing process, and improved efficiency is desirable.

In a conventional light-emitting layer formed by mixing host and dopant, the ratio between host and dopant and the uniformity of dopant need to be considered. Since the whole host can emit light, the light-emitting area may be transferred with the alteration of operating voltage. When manufacturing a white OLED device, a light-emitting layer comprising various mixtures of host and dopant or one host doped with two or more dopants is required. However, the light color of the white OLED device is altered with the operating voltage or brightness. Therefore, when manufacturing a white OLED device, only the precise control of parameters and the use of sophisticated equipment can improve the yield.

SUMMARY

One embodiment of the disclosure provides a white organic light-emitting diode, comprising: an anode; a cathode; and a composite light-emitting layer formed between the anode and the cathode, wherein the composite light-emitting layer comprises a first host layer, a second host layer, and a dye layer formed between the first host layer and the second host layer, and the dye layer comprises at least two dyes.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1:
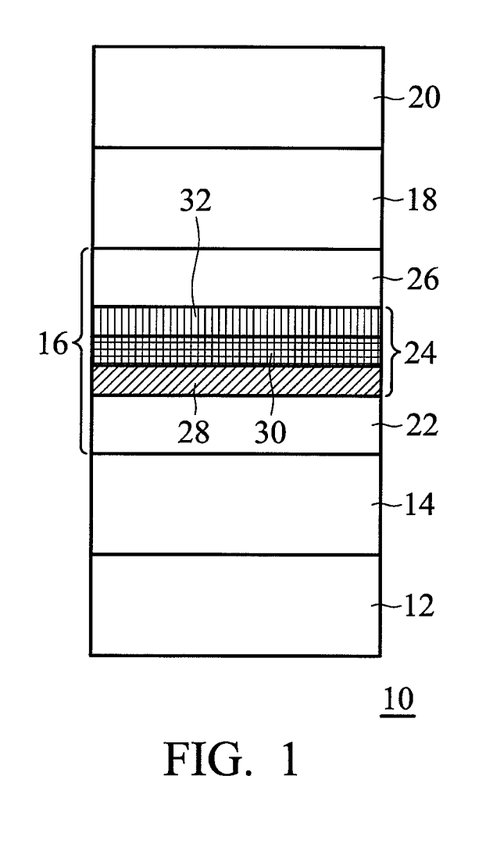
FIG. 1 shows a cross-sectional view of a white organic light-emitting diode according to one embodiment of the disclosure.

Referring to FIG. 1, according to one embodiment of the disclosure, a white organic light-emitting diode is provided. A white organic light-emitting diode 10 comprises an anode 12, a hole transport layer (HTL) 14, a composite light-emitting layer 16, an electron transport layer (ETL) 18, and a cathode 20. The composite light-emitting layer 16 is formed between the anode 12 and the cathode 20. The hole transport layer (HTL) 14 is formed between the anode 12 and the composite light-emitting layer 16. The electron transport layer (ETL) 18 is formed between the composite light-emitting layer 16 and the cathode 20. The composite light-emitting layer 196 comprises a first host layer 22, a dye layer 24 and a second host layer 26. The dye layer 24 is formed between the first host layer 22 and the second host layer 26. The first host layer 22 has a thickness of about 0.5-30 nm. The second host layer 26 has a thickness of about 0.5-30 nm. Specifically, the dye layer 24 comprises at least two dyes. In this embodiment, the dye layer 24 is divided into three sub-dye layers, for example, a first sub-dye layer 28, a second sub-dye layer 30, and a third sub-dye layer 32. Each sub-dye layer may comprise a phosphorescent material or a fluorescent material having an emission wavelength. For example, the first sub-dye layer 28 comprises a blue phosphorescent dye of FIrpic ($C_{28}H_{16}F_4IrN_3O_2$). The second sub-dye layer 30 comprises a yellow phosphorescent dye of PO-01 ($C_{31}H_{23}IrN_2O_2S_2$). The third sub-dye layer 32 comprises a blue phosphorescent dye of FIrpic ($C_{28}H_{16}F_4IrN_3O_2$). The sub-dye layer (e.g., the second sub-dye layer 30) located in the intermediate position among the sub-dye layers (e.g., the first sub-dye layer 28, the second sub-dye layer 30, and the third sub-dye layer 32) has the maximum emission wavelength (e.g., yellow light). Each sub-dye layer has a thickness of about 0.01-1 nm. In this embodiment, one of the first host layer 22 and the second host layer 26 may also comprise a dye.

Figure 2:
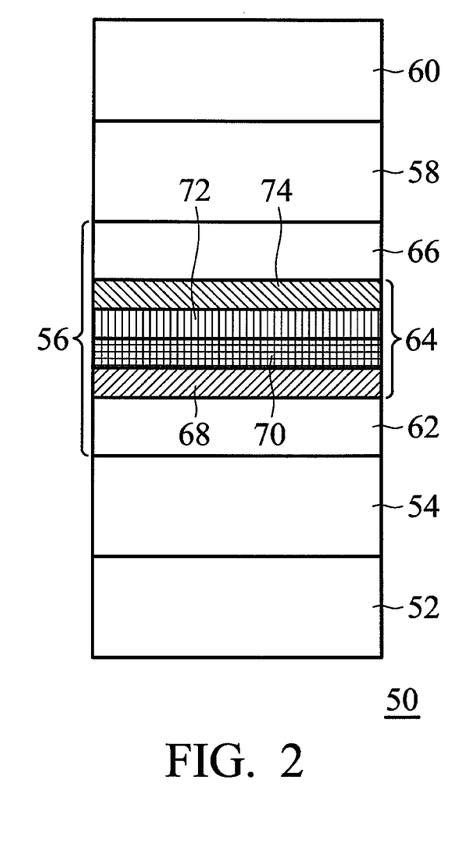
FIG. 2 shows a cross-sectional view of a white organic light-emitting diode according to one embodiment of the disclosure.

Referring to FIG. 2, according to one embodiment of the disclosure, a white organic light-emitting diode is provided. A white organic light-emitting diode 50 comprises an anode 52, a hole transport layer (HTL) 54, a composite light-emitting layer 56, an electron transport layer (ETL) 58 and a cathode 60. The composite light-emitting layer 56 is formed between the anode 52 and the cathode 60. The hole transport layer (HTL) 54 is formed between the anode 52 and the composite light-emitting layer 56. The electron transport layer (ETL) 58 is formed between the composite light-emitting layer 56 and the cathode 60. The composite light-emitting layer 56 comprises a first host layer 62, a dye layer 64 and a second host layer 66. The dye layer 64 is formed between the first host layer 62 and the second host layer 66. The first host layer 62 has a thickness of about 0.5-30 nm. The second host layer 66 has a thickness of about 0.5-30 nm. Specifically, the dye layer 64 comprises at least two dyes. In this embodiment, the dye layer 64 is divided into four sub-dye layers, for example, a first sub-dye layer 68, a second sub-dye layer 70, a third sub-dye layer 72 and a fourth sub-dye layer 74. Each sub-dye layer may comprise a phosphorescent material or a fluorescent material having an emission wavelength. For example, the first sub-dye layer 68 comprises a green phosphorescent dye of CF3BNO-acac ($C_{33}H_{23}F_6IrN_4O_4$). The second sub-dye layer 70 comprises a red phosphorescent dye of Os-red ($C_{42}H_{34}F_6N_8OsP_2$). The third sub-dye layer 72 comprises a yellow phosphorescent dye of PO-01 ($C_{31}H_{23}IrN_2O_2S_2$). The fourth sub-dye layer 74 comprises a blue phosphorescent dye of FIrpic ($C_{28}H_{16}F_4IrN_3O_2$). The sub-dye layer (e.g., the second sub-dye layer 70) located in the intermediate position among the sub-dye layers (e.g., the first sub-dye layer 68, the second sub-dye layer 70, the third sub-dye layer 72, and the fourth sub-dye layer 74) has the maximum emission wavelength (e.g., red light). Each sub-dye layer has a thickness of about 0.01-1 nm. In this embodiment, one of the first host layer 62 and the second host layer 66 may also comprise a dye.

Figure 3:
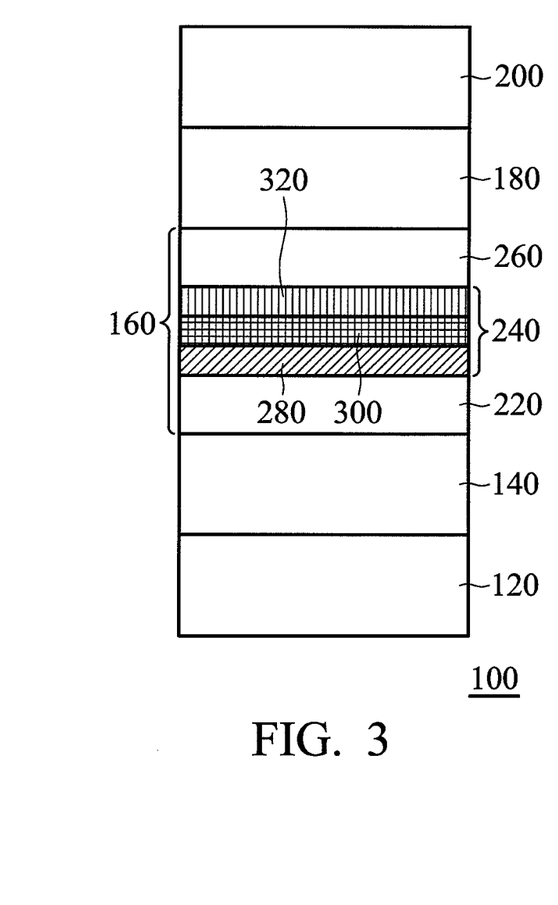
FIG. 3 shows a cross-sectional view of a white organic light-emitting diode according to one embodiment of the disclosure.

Referring to FIG. 3, according to one embodiment of the disclosure, a white organic light-emitting diode is provided. A white organic light-emitting diode 100 comprises an anode 120, a hole transport layer (HTL) 140, a composite light-emitting layer 160, an electron transport layer (ETL) 180, and a cathode 200. The composite light-emitting layer 160 is formed between the anode 120 and the cathode 200. The hole transport layer (HTL) 140 is formed between the anode 120 and the composite light-emitting layer 160. The electron transport layer (ETL) 180 is formed between the composite light-emitting layer 160 and the cathode 200. The composite light-emitting layer 160 comprises a first host layer 220, a dye layer 240 and a second host layer 260. The dye layer 240 is formed between the first host layer 220 and the second host layer 260. The first host layer 220 has a thickness of about 0.5-30 nm. The second host layer 260 has a thickness of about 0.5-30 nm. Specifically, the dye layer 240 comprises at least two dyes. In this embodiment, the dye layer 240 is divided into three sub-dye layers, for example, a first sub-dye layer 280, a second sub-dye layer 300, and a third sub-dye layer 320. Each sub-dye layer may comprise a phosphorescent material or a fluorescent material having an emission wavelength. For example, the first sub-dye layer 280 comprises a blue fluorescent dye of EB515 (purchased from e-Ray Optoelectronics Technology Co., Ltd.). The second sub-dye layer 300 comprises a yellow fluorescent dye of EY53 (purchased from e-Ray Optoelectronics Technology Co., Ltd.). The third sub-dye layer 320 comprises a blue fluorescent dye of EB515 (purchased from e-Ray Optoelectronics Technology Co., Ltd.). The sub-dye layer (e.g., the second sub-dye layer 300) located in the intermediate position among the sub-dye layers (e.g., the first sub-dye layer 280, the second sub-dye layer 300 and the third sub-dye layer 320) has the maximum emission wavelength (e.g., yellow light). Each sub-dye layer has a thickness of about 0.01-1 nm. In this embodiment, one of the first host layer 220 and the second host layer 260 may also comprise a dye.

Figure 4:
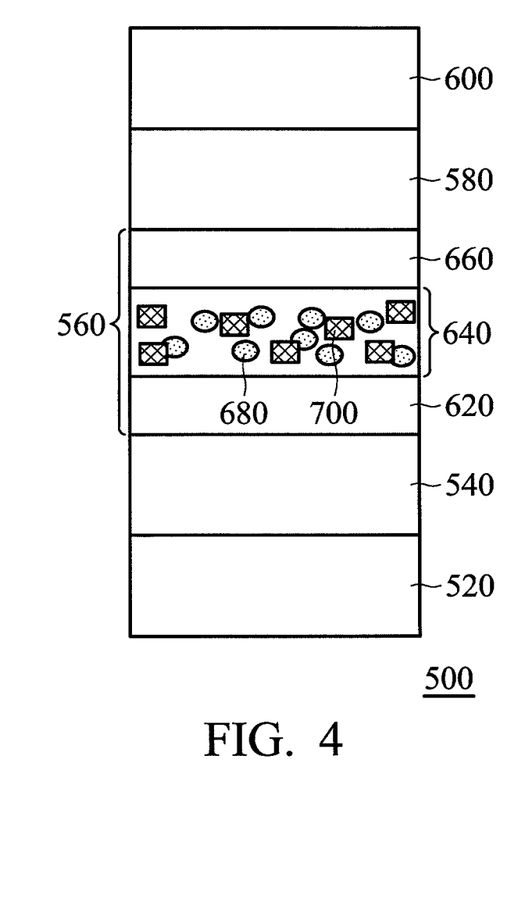
FIG. 4 shows a cross-sectional view of a white organic light-emitting diode according to one embodiment of the disclosure.

Referring to FIG. 4, according to one embodiment of the disclosure, a white organic light-emitting diode is provided. A white organic light-emitting diode 500 comprises an anode 520, a hole transport layer (HTL) 540, a composite light-emitting layer 560, an electron transport layer (ETL) 580 and a cathode 600. The composite light-emitting layer 560 is formed between the anode 520 and the cathode 600. The hole transport layer (HTL) 540 is formed between the anode 520 and the composite light-emitting layer 560. The electron transport layer (ETL) 580 is formed between the composite light-emitting layer 560 and the cathode 600. The composite light-emitting layer 560 comprises a first host layer 620, a dye layer 640, and a second host layer 660. The dye layer 640 is formed between the first host layer 620 and the second host layer 660. The first host layer 620 has a thickness of about 0.5-30 nm. The second host layer 660 has a thickness of about 0.5-30 nm. Specifically, the dye layer 640 comprises at least two dyes. In this embodiment, the dye layer 640 comprises two dyes mixed therein, for example, a first dye 680 and a second dye 700. The first dye 680 and the second dye 700 may comprise a phosphorescent material or a fluorescent material having an emission wavelength. For example, the first dye 680 comprises a blue fluorescent dye of EB515 (purchased from e-Ray Optoelectronics Technology Co., Ltd.). The second dye 700 comprises a yellow fluorescent dye of EY53 (purchased from e-Ray Optoelectronics Technology Co., Ltd.). The dye layer 640 has a thickness of about 0.01-3 nm. In this embodiment, one of the first host layer 620 and the second host layer 660 may also comprise a dye.

When the dye layer 640 is evaporated on the first host layer 620, the cumulative thickness of, for example, the blue fluorescent dye of EB515 and the yellow fluorescent dye of EY53 are detected. Once the cumulative thickness of one of them achieves a default thickness, the evaporation of that dye is stopped. Another dye is continuously evaporated. Deliberately controlling of the evaporation rates of EB515 and EY53 is not required. Although the dye layer 640 is still fabricated by co-evaporation, the adjustment of the process parameters thereof becomes more flexible.

The disclosure provides a novel light-emitting layer structure of an OLED device. Compared to a conventional light-emitting layer formed by mixing host and dopant, in which the ratio between host and dopant and the uniformity of dopant need to be considered, the host layer and the dye (dopant) layer of the OLED device in the disclosure are independent. In addition, in the dye layer, each sub-dye layer is evaporated in order and forms an independent layer as set forth in FIG. 1; or all dyes are evaporated simultaneously, controlling the cumulative thickness of each dye and forming a dye layer with all dyes mixed therein as a set forth in FIG. 4 without taking into consideration the uniformity of mixing among the dyes. An OLED device made by the light-emitting layer structure is capable of decreasing the complexity of the manufacturing process and equipment and easily manufacturing single-color and white OLED devices. Besides, the sub-dye layer located at the light-emitting area is extremely thin which causes the OLED device to maintain a low operating voltage, improve device efficiency (current efficiency and power efficiency), and slow down the declining degree of device efficiency with the increase of brightness. For the white OLED device of the disclosure, since all dyes with various light colors are within the light-emitting area, each light color also maintains at a fixed ratio thereamong, therefore, for the chromaticity coordinate (CIE (x, y)), the alteration thereof with the increase of brightness is rare.

Example 1

The White Organic Light-Emitting Diode Device I

Referring to FIG. 1, the structure of the white organic light-emitting diode device I of this example is illustrated as follows.

The anode 12 was ITO. The hole transport layer (HTL) 14 was TAPC (30 nm). The first host layer 22 was TCTA (4 nm). The second host layer 26 was CzDBS (4 nm). The electron transport layer (ETL) 18 was TmPyPB (35 nm). An electron injection layer (EIL) (not shown) was $Cs_2CO_3$ (3 nm). The cathode 20 was aluminum. The dye layer 24 comprised a stacked layer of the first sub-dye layer 28, the second sub-dye layer 30, and the third sub-dye layer 32. The first sub-dye layer 28 comprised the blue phosphorescent dye of FIrpic (0.1 nm). The second sub-dye layer 30 comprised the yellow phosphorescent dye of PO-01 (0.01 nm). The third sub-dye layer 32 comprised the blue phosphorescent dye of FIrpic (0.1 nm).

Figure 6:
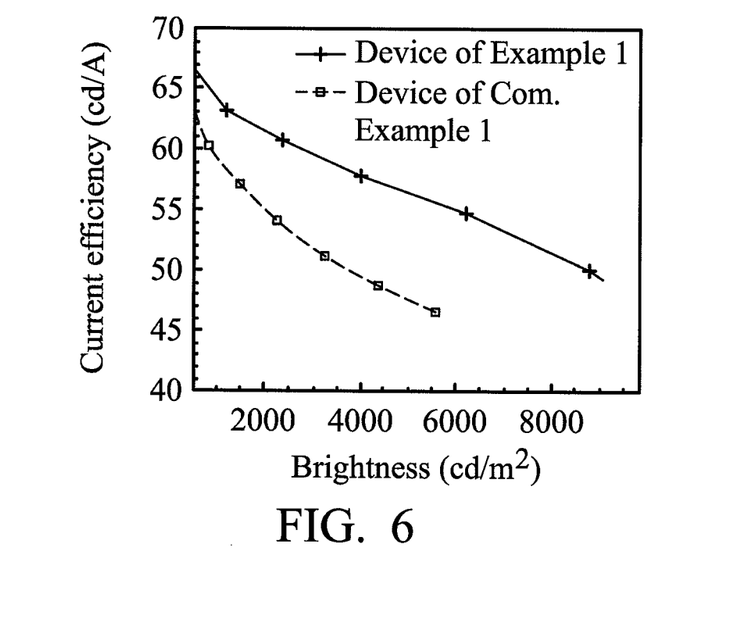
FIG. 6 shows the relationship between current efficiency and brightness of various white organic light-emitting diodes according to one embodiment of the disclosure.
Figure 7:
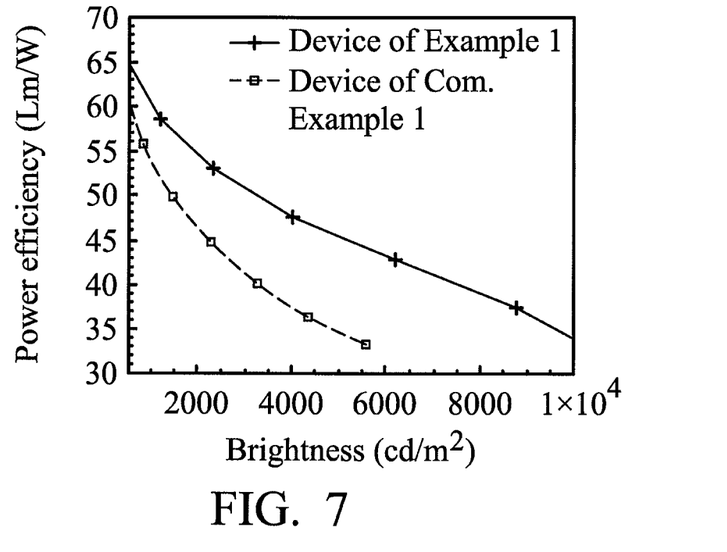
FIG. 7 shows the relationship between power efficiency and brightness of various white organic light-emitting diodes according to one embodiment of the disclosure.

In this example, when the operating voltage of the device was 3.4V, the current density thereof was 1.88 $mA/cm^2$, the brightness thereof was 1187 $cd/m^2$ (referring to FIG. 5), and the device efficiency thereof was 63.10 cd/A (e.g., the current efficiency, referring to FIG. 6) and 58.501 m/W (e.g., the power efficiency, referring to FIG. 7).

TAPC: $C_{46}H_{46}N_2$

TAPC

TCTA: $C_{54}H_{36}N_4$

TCTA

CzDBS: $C_{48}H_{30}N_2S$

TmPyPB: $C_{39}H_{27}N_3$

FIrpic: $C_{28}H_{16}F_4IrN_3O_2$

FIrpic

PO-01: $C_{31}H_{23}IrN_2O_2S_2$

PO-01

Comparative Example 1

A Conventional White Organic Light-Emitting Diode Device

Figure 8:
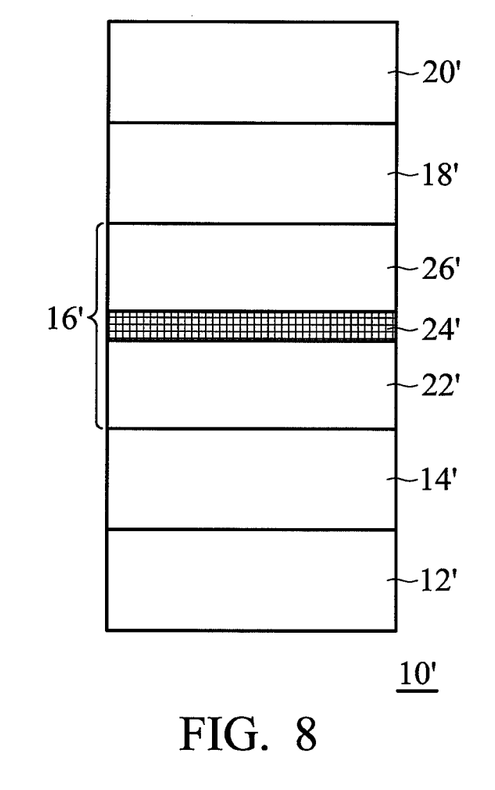
FIG. 8 shows a cross-sectional view of a conventional white organic light-emitting diode.

Referring to FIG. 8, the structure of a conventional white organic light-emitting diode device of this comparative example is illustrated as follows.

The anode 12' was ITO. The hole transport layer (HTL) 14' was TAPC (30 nm). The first host layer 22' comprised TCTA and FIrpic (7.6%, 5 nm). The second host layer 26' comprised CzDBS and FIrpic (7.6%, 5 nm). The electron transport layer (ETL) 18' was TmPyPB (40 nm). The electron injection layer (EIL) (not shown) was $Cs_2CO_3$ (3 nm). The cathode 20' was aluminum. The dye layer 24' comprised a yellow phosphorescent dye of PO-01 (0.01 nm).

In this comparative example, when the operating voltage of the device was 3.6V, the current density thereof was 2.60 mA/$cm^2$, the brightness thereof was 1474 cd/$m^2$ (referring to FIG. 5), and the device efficiency thereof was 57.15 cd/A (e.g., the current efficiency, referring to FIG. 6) and 49.881 m/W (e.g., the power efficiency, referring to FIG. 7).

Figure 5:
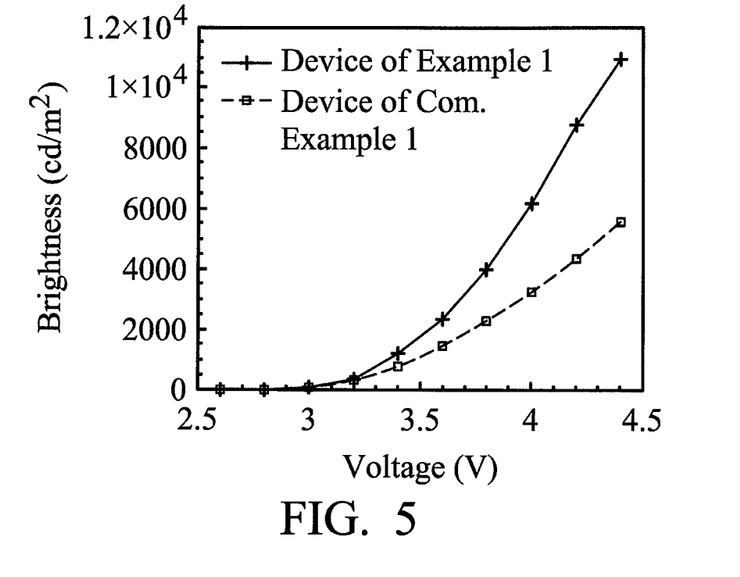
FIG. 5 shows the relationship between brightness and voltage of various white organic light-emitting diodes according to one embodiment of the disclosure.

In accordance with FIG. 5 (showing the relationship between brightness and voltage), the operating voltage of the device of Example 1 was lower than that of the device of Comparative Example 1. For example, when the brightness of the device achieved 1,000 cd/$m^2$, the operating voltage of the device of Example 1 was lower than 3.4V. However, the operating voltage of the device of Comparative Example 1 was about 3.5V.

In accordance with FIG. 6 (showing the relationship between current efficiency and brightness) and FIG. 7 (showing the relationship between power efficiency and brightness), the current efficiency of the device of Example 1 was higher than that of the device of Comparative Example 1. Also, as the brightness was increased, the declining range of the current efficiency of the device of Example 1 was smaller than that of the device of Comparative Example 1. When the brightness of the device achieved 1,000 cd/$m^2$, the current efficiency of the devices of Example 1 and Comparative Example 1 was about 64 cd/A and 60 cd/A, respectively. The power efficiency of the devices of Example 1 and Comparative Example 1 was about 601 m/W and 541 m/W, respectively.

Figure 9:
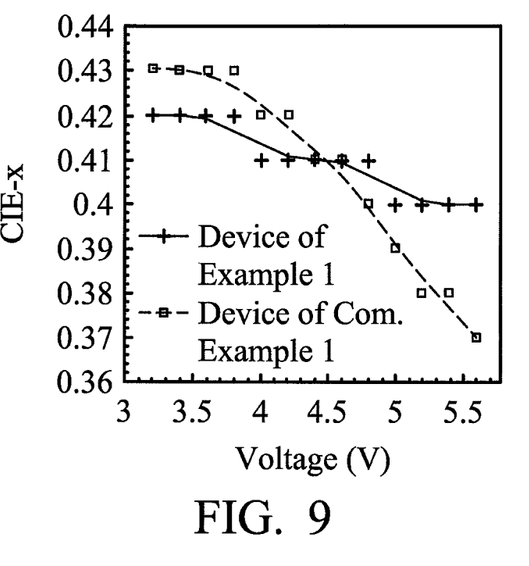
FIG. 9 shows the relationship between CIE-x and voltage of various white organic light-emitting diodes according to one embodiment of the disclosure.
Figure 10:
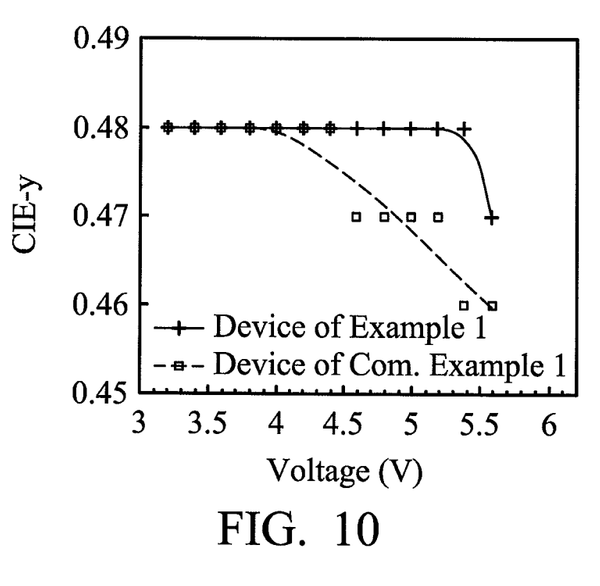
FIG. 10 shows the relationship between CIE-y and voltage of various white organic light-emitting diodes according to one embodiment of the disclosure.

Additionally, as the operating voltage was increased, the variations of the light color of the white organic light-emitting diode devices were shown in FIG. 9 (showing the relationship between CIE-x and voltage) and FIG. 10 (showing the relationship between CIE-y and voltage). In the figures, as the operating voltage was increased, the variation of the light color of the device of Example 1 was small. The range of the variation of the CIE (x, y) of the device of Example 1 was smaller than that of the device of Comparative Example 1 due to the device with a merely 0.21 nm-thick light-emitting area of Example 1 resulting in no shifting of the light-emitting area as the operating voltage or current was increased. The reason causing the variation of the light color of the device is that when the luminescence of the dye, for example PO-01, was saturated, as the operating voltage was continuously increased, the CIE (x, y) of the device was shifted to the range of blue light.

Example 2

The White Organic Light-Emitting Diode Device II

Referring to FIG. 2, the structure of the white organic light-emitting diode device II of this example is illustrated as follows.

The anode 52 was ITO. The hole transport layer (HTL) 54 was TAPC (30 nm). The first host layer 62 was TCTA (4 nm). The second host layer 66 was CzDBS (4 nm). The electron transport layer (ETL) 58 was TmPyPB (35 nm). The electron injection layer (EIL) (not shown) was $Cs_2CO_3$ (3 nm). The cathode 60 was aluminum. The dye layer 64 comprised a stacked layer of the first sub-dye layer 68, the second sub-dye layer 70, the third sub-dye layer 72, and the fourth sub-dye layer 74. The first sub-dye layer 68 comprised the green phosphorescent dye of CF3BNO-acac (0.01 nm). The second sub-dye layer 70 comprised the red phosphorescent dye of Os-red (0.01 nm). The third sub-dye layer 72 comprised the yellow phosphorescent dye of PO-01 (0.01 nm). The fourth sub-dye layer 74 comprised the blue phosphorescent dye of FIrpic (0.1 nm).

In this example, when the operating voltage of the device was 3.4V, the current density thereof was 2.24 mA/$cm^2$, the brightness thereof was 958 cd/$m^2$, and the device efficiency thereof was 42.82 cd/A (e.g., the current efficiency) and 39.561 m/W (e.g., the power efficiency).

Figure 11:
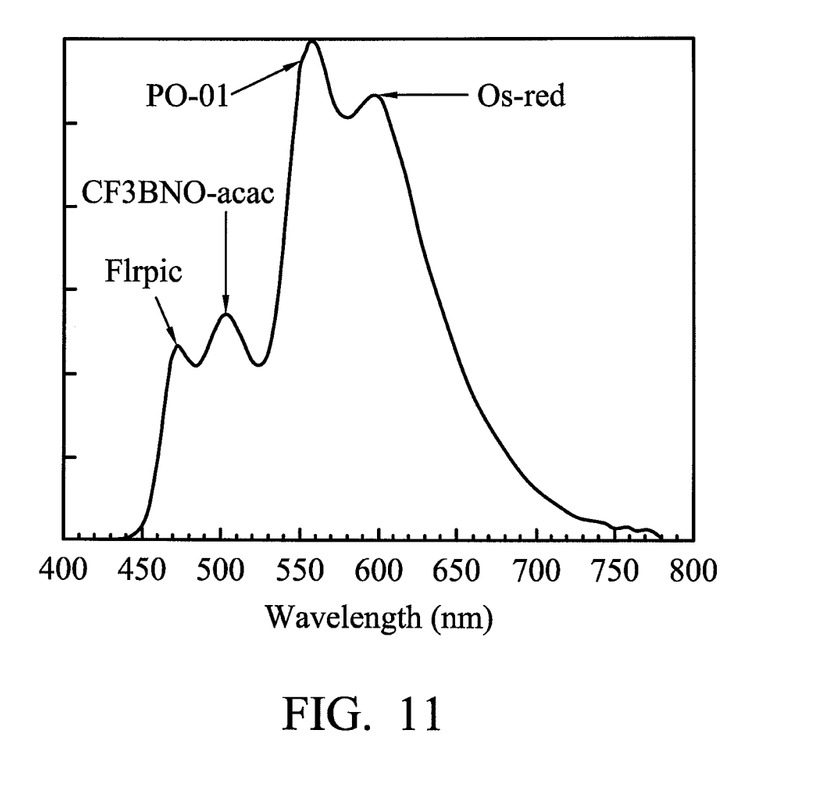
FIG. 11 shows the emission spectrum of a white organic light-emitting diode according to one embodiment of the disclosure.

Referring to FIG. 11, the emission spectrum of the device shows that each sub-dye layer emitted light. In this example, various dyes with different light colors were utilized in the device and each dye simultaneously emitted light within its light-emitting area due to the limitation of the thickness of each sub-dye layer to an extremely thin thickness. Additionally, the ratios among various light colors were further adjusted by altering the thickness of the sub-dye layer, thus obtaining the white organic light-emitting diode device with high color rendering.

CF3BNO-acac: $C_{33}H_{23}F_6IrN_4O_4$

CF3BNO-acac

Os-red: $C_{42}H_{34}F_6N_8OsP_2$

Os-Red

Example 3

The White Organic Light-Emitting Diode Device III

Referring to FIG. 3, the structure of the white organic light-emitting diode device III of this example is illustrated as follows.

The anoded 120 was ITO. The hole transport layer (HTL) 140 was NPB (40 nm). The first host layer 220 was EB43 (5 nm). The second host layer 260 was EB43 (5 nm). The electron transport layer (ETL) 180 was Alq3 (25 nm). The electron injection layer (EIL) (not shown) was LiF (1 nm). The cathode 200 was aluminum. The dye layer 240 comprised a stacked layer of the first sub-dye layer 280, the second sub-dye layer 300, and the third sub-dye layer 320. The first sub-dye layer 280 comprised the blue fluorescent dye of EB515 (0.3 nm). The second sub-dye layer 300 comprised the yellow fluorescent dye of EY53 (0.02 nm). The third sub-dye layer 320 comprised the blue fluorescent dye of EB515 (0.3 nm).

In this example, when the operating voltage of the device was 4.8V, the current density thereof was 14.98 mA/cm², the brightness thereof was 1053 cd/m², and the device efficiency thereof was 7.03 cd/A (e.g., the current efficiency) and 4.601 m/W (e.g., the power efficiency). The device efficiency can be further improved by adjusting the thickness or arrangement of the sub-dye layers.

NPB: $C_{44}H_{32}N_2$

NPB

EB43: a material produced from e-Ray Optoelectronics Technology Co., Ltd.

Alq3: $C_{27}H_{18}AlN_3O_3$

EB515: a material produced from e-Ray Optpelectroics Technology Co., Ltd.

EY53: a material produced from e-Ray Optoelectronics Technology Co., Ltd.

Comparative Example 2

A Conventional White Organic Light-Emitting Diode Device

Figure 12:
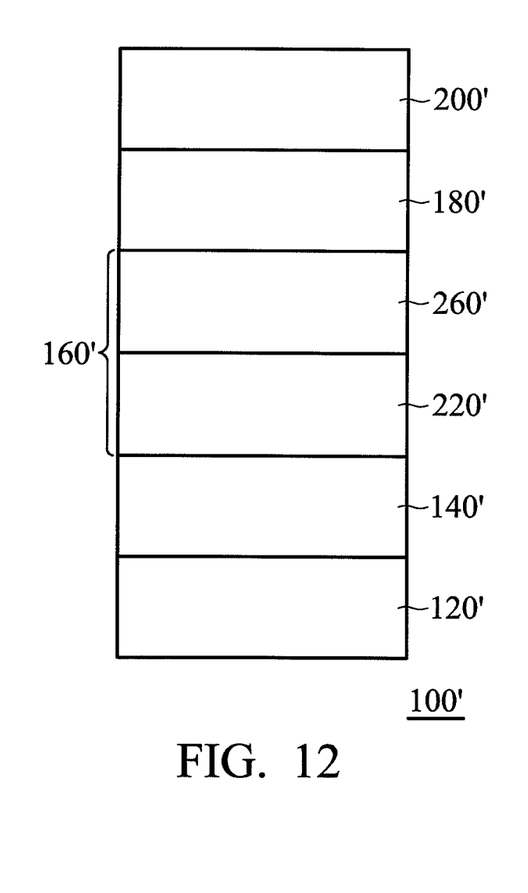
FIG. 12 shows a cross-sectional view of a conventional white organic light-emitting diode.

Referring to FIG. 12, the structure of a conventional white organic light-emitting diode device of this comparative example is illustrated as follows.

The anode 120' was ITO. The hole transport layer (HTL) 140' was NPB (40 nm). The first host layer 220' comprised EB43 and EY53 (1%, 4 nm). The second host layer 260' comprised EB43 and EB515 (8%, 15 nm). The electron transport layer (ETL) 180' was Alq3 (25 nm). The electron injection layer (EIL) (not shown) was LiF (1 nm). The cathode 200' was aluminum.

In this comparative example, when the operating voltage of the device was 5.7V, the current density thereof was 14.25 mA/cm², the brightness thereof was 1169 cd/m², and the device efficiency thereof was 7.84 cd/A (e.g., the current efficiency) and 4.321 m/W (e.g., the power efficiency).

The operating voltage (4.8V) of the device of Example 3 was apparently lower than the operating voltage (5.7V) of the device of Comparative Example 2.

Example 4

The White Organic Light-Emitting Diode Device IV

Referring to FIG. 4, the structure of the white organic light-emitting diode device IV of this example is illustrated as follows.

The anode 520 was ITO. The hole transport layer (HTL) 540 was NPB (40 nm). The first host layer 620 was EB43 (5 nm). The second host layer 660 was EB43 (5 nm). The electron transport layer (ETL) 580 was Alq3 (25 nm). The electron injection layer (EIL) (not shown) was LiF (1 nm). The cathode 600 was aluminum. The dye layer 640 comprised the first dye 680 and the second dye 700 mixed therein. The first dye 680 comprised the blue fluorescent dye of EB515 (0.6 nm). The second dye 700 comprised the yellow fluorescent dye of EY53 (0.04 nm).

In this example, when the operating voltage of the device was 5.2V, the current density thereof was 15.94 mA/cm², the brightness thereof was 1230 cd/m², and the device efficiency thereof was 7.26 cd/A (e.g., the current efficiency) and 4.391 m/W (e.g., the power efficiency).

It will be apparent to those skilled in the art that various modifications and variations can be made to the disclosed embodiments. It is intended that the specification and examples be considered as exemplary only, with the true scope of the disclosure being indicated by the following claims and their equivalents.

What is claimed is:

1. A white organic light-emitting diode, comprising:
   an anode;
   a cathode;
   a composite light-emitting layer formed between the anode and the cathode, wherein the composite light-emitting layer comprises a first host layer, a second host layer, and a dye layer formed between the first host layer and the second host layer, wherein the dye layer is divided into a plurality of sub-dye layers, and each sub-dye layer comprises a dye having an emission wavelength, wherein the sub-dye layers are formed next to and in direct contact with each other;

a hole transport layer formed between the anode and the composite light-emitting layer; and an electron transport layer formed between the composite light-emitting layer and the cathode.

2. The white organic light-emitting diode as claimed in claim 1, wherein the first host layer and the second host layer each have a thickness of 0.5-30 nm.

3. The white organic light-emitting diode as claimed in claim 1, wherein the dye comprises phosphorescent materials or fluorescent materials.

4. The white organic light-emitting diode as claimed in claim 1, wherein the sub-dye layer located in the intermediate position among the sub-dye layers has the maximum emission wavelength.

5. The white organic light-emitting diode as claimed in claim 1, wherein the sub-dye layer has a thickness of 0.01-1 nm.

6. The white organic light-emitting diode as claimed in claim 1, wherein the dye layer comprises at least two dyes mixed therein.

7. The white organic light-emitting diode as claimed in claim 6, wherein the dye comprises phosphorescent materials or fluorescent materials.

8. The white organic light-emitting diode as claimed in claim 6, wherein the dye layer has a thickness of 0.01-3 nm.

9. The white organic light-emitting diode as claimed in claim 1, wherein none or one of the first host layer and the second host layer comprises a dye.

* * * * *